US010552251B2

United States Patent
Qin et al.

(10) Patent No.: US 10,552,251 B2
(45) Date of Patent: Feb. 4, 2020

(54) STORAGE OF NEURAL NETWORKS

(71) Applicant: WESTERN DIGITAL TECHNOLOGIES, INC., San Jose, CA (US)

(72) Inventors: Minghai Qin, San Jose, CA (US); Dejan Vucinic, San Jose, CA (US); Chao Sun, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 122 days.

(21) Appl. No.: 15/839,521

(22) Filed: Dec. 12, 2017

(65) Prior Publication Data

US 2019/0073259 A1 Mar. 7, 2019

Related U.S. Application Data

(60) Provisional application No. 62/554,851, filed on Sep. 6, 2017.

(51) Int. Cl.
| | | |
|---|---|---|
| G06F 11/00 | (2006.01) | |
| G06F 11/08 | (2006.01) | |
| G06N 3/02 | (2006.01) | |
| G06N 20/00 | (2019.01) | |
| G11C 13/00 | (2006.01) | |

(52) U.S. Cl.
CPC .............. *G06F 11/08* (2013.01); *G06N 3/02* (2013.01); *G06N 20/00* (2019.01); *G11C 13/0004* (2013.01)

(58) Field of Classification Search
CPC . G06F 11/08; G11C 29/70; G11C 2029/0411; G11C 13/0002; G11C 13/0004; G06N 20/00; G06N 3/02
USPC .......................................................... 714/25
See application file for complete search history.

(56) References Cited

U.S. PATENT DOCUMENTS

| | | | |
|---|---|---|---|
| 2005/0071174 A1* | 3/2005 | Leibowitz | G06Q 10/10 705/35 |
| 2009/0070630 A1* | 3/2009 | Khatri | G06F 11/073 714/37 |
| 2015/0324691 A1* | 11/2015 | Dropps | G06N 3/04 706/25 |

(Continued)

OTHER PUBLICATIONS

Chan et al., "A True Single-Transistor Oxide-Nitride-Oxide EEPROM Device," IEEE Electron Device Letters, vol. EDL-8, No. 3, Mar. 1987, pp. 93-95.

(Continued)

*Primary Examiner* — Yair Leibovich
(74) *Attorney, Agent, or Firm* — Foley & Lardner LLP

(57) ABSTRACT

Disclosed include a device and a method for storing a neural network. The device includes a plurality of memory cells configured to store weights of the neural network. The plurality of memory cells may include one or more faulty cells. The device further includes a processor coupled to the plurality of memory cells. The processor is configured to construct the neural network based on a structure of the neural network and a subset of the weights stored by the plurality of memory cells. The subset of the weights may exclude another subset of the weights stored by one or more memory cells comprising the one or more faulty cells.

21 Claims, 10 Drawing Sheets

(56) References Cited

U.S. PATENT DOCUMENTS

2016/0335536 A1* 11/2016 Yamazaki ............ G06N 3/0454
2018/0018555 A1* 1/2018 Wong ........................ G06F 7/58

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.
Nozaki et al., "A 1-Mb EEPROM with MONOS Memory Cell for Semiconductor Disk Application," IEEE Journal of Solid-State Circuits, vol. 26, No. 4, Apr. 1991, pp. 497-501.

* cited by examiner

STORAGE OF NEURAL NETWORKS

CROSS-REFERENCE TO RELATED APPLICATION

The present application claims priority to U.S. Provisional Application No. 62/554,851 filed on Sep. 6, 2017, which is incorporated by reference herein in its entirety.

BACKGROUND

The following description is provided to assist the understanding of the reader. None of the information provided or references cited is admitted to be prior art.

Neural networks are often used in machine learning tasks. Parameters such as weights resulting from training a neural network are often stored in data storage media. The stored parameters are often protected against error by using Error Correcting Codes (ECCs). However, ECCs typically add to a storage overhead in terms of both usage of the storage media and the processing required to access the parameters. This can result in a corresponding latency and/or reduction in bandwidth when accessing the parameters from the storage media. In applications where bandwidth or processing time is critical, such as with time sensitive video recognition (e.g., pedestrian detection) or on-line speech translation, the latency and reduction in bandwidth due to ECCs can have a significant impact on overall system performance.

The performance of the recognition or detection through the neural networks may depend on available processing and memory resources given the large number of parameters that are used in most neural networks. Such processing and memory limitations may be apparent for consumer products such as vehicles or smartphones. For example, a self-driving vehicle may need to quickly process video data to recognize and react to road conditions. However, the amount of processing and memory resources may be limited in the vehicle due to cost and space constraints. The increase in storage overhead and the corresponding latency and/or reduction in bandwidth caused by ECCs may therefore limit the practical use of neural networks.

SUMMARY

Various embodiments disclosed herein are related to a device for storing a neural network. The device includes a plurality of memory cells configured to store weights of the neural network. The plurality of memory cells may include one or more faulty cells. The device further includes a processor coupled to the plurality of memory cells. The processor is configured to construct the neural network based on a structure of the neural network and a subset of the weights stored by the plurality of memory cells. The subset of the weights may exclude another subset of the weights stored by one or more memory cells comprising the one or more faulty cells.

In one or more embodiments, the plurality of memory cells are implemented in a resistive memory or a phase change memory.

In one or more embodiments, the one or more faulty cells comprise one or more stuck-at-fault cells.

In one or more embodiments, the processor is configured to perform a cyclic redundancy check on the plurality of memory cells, and detect the one or more faulty cells from the plurality of memory cells based on the cyclic redundancy check.

In one or more embodiments, the processor is configured to construct the neural network by substituting zero for the another subset of the weights stored by the one or more memory cells comprising the one or more faulty cells. The processor may be configured to construct the neural network by substituting the zero for the another subset of the weights stored by the one or more memory cells, in response to determining that a ratio between a number of the one or more faulty cells and a number of the plurality of memory cells is less than a predetermined threshold.

In one or more embodiments, the processor is configured to retrain the weights stored by the plurality of memory cells, in response to detecting the one or more faulty cells.

In one or more embodiments, the processor is configured to retrain the another subset of the weights stored by the one or more memory cells and bypass retraining the subset of the weights stored by the subset of the plurality of memory cells, in response to detecting the one or more faulty cells.

In one or more embodiments, the plurality of memory cells are non-erasable.

In one or more embodiments, the processor is further configured to receive input data indicating an image, audio, or a combination of the image and the audio, and determine a feature in the input data according to the neural network constructed based on the structure of the neural network and the subset of the weights stored by the subset of the plurality of memory cells.

In one or more embodiments, the structure of the neural network is stored by a first memory device, and the weights are stored by the plurality of memory cells of a second memory device different from the first memory device.

Various embodiments disclosed herein are related to a device including a plurality of memory cells configured to store weights of a neural network. Each weight may be stored by a corresponding vector of one or more memory cells of the plurality of memory cells. Each vector may be associated with a corresponding indicator indicative of whether the vector stores an incorrect weight. The device further includes a processor coupled to the plurality of memory cells. The processor is configured to detect a vector of one or more memory cells of the plurality of memory cells storing the incorrect weight based on the indicator. The processor is further configured to substitute a default value for the incorrect weight stored by the detected vector. The processor is further configured to construct the neural network based on the substituted default value.

In one or more embodiments, each indicator comprises a single bit.

In one or more embodiments, the processor is further configured to perform a cyclic redundancy check on the vector of the one or more memory cells and the indicator, and detect whether the vector of the one or more memory cells stores the incorrect weight based on the cyclic redundancy check.

In one or more embodiments, each indicator indicates whether a corresponding cell is a stuck-at-fault cell.

In one or more embodiments, the plurality of memory cells are memory cells of a resistive non-volatile memory device.

In one or more embodiments, the processor is configured to construct the neural network by substituting the default value, in response to determining that a ratio between a number of memory cells storing incorrect weights and a number of the plurality of memory cells is less than a predetermined threshold.

Various embodiments disclosed herein are related to a method of storing and constructing a neural network. The method includes detecting a subset of a plurality of memory cells, where the subset of the plurality of memory cells includes stuck-at-fault cells. The method further includes substituting a default value for a set of weights of the neural network, where the set of the weights may be stored by the stuck-at-fault cells. The method further includes constructing the neural network based on (i) a stored structure of the neural network, (ii) another set of the weights of the neural network stored by another subset of the plurality of memory cells, and (iii) the substituted default value.

In one or more embodiments, the method further includes substituting the default value for the set of the weights, in response to determining that a ratio between a number of the stuck-at-fault cells and a number of the plurality of memory cells is less than a predetermined threshold.

Various embodiments disclosed herein are related to a device for storing a neural network. The device includes means for detecting a subset of a plurality of memory cells, where the subset of the plurality of memory cells includes stuck-at-fault cells. The device further includes means for substituting a default value for a set of weights of the neural network, where the set of the weights is stored by the stuck-at-fault cells. The device further includes means for constructing the neural network based on (i) a stored structure of the neural network, (ii) another set of the weights of the neural network stored by another subset of the plurality of memory cells, and (iii) the substituted default value.

Various embodiments disclosed are related to a method of storing a neural network. The method includes separating weight data related to the neural network from other data related to the neural network. The method further includes encoding the other data related to the neural network using error correction. The method further includes encoding and storing the encoded data with error correction into a non-volatile memory. The method further includes for the weight data related to the neural network, bypassing error correction encoding and generating Cyclic Redundancy Check (CRC) data. The method further includes storing the weight data and the CRC data into the non-volatile memory.

In one or more embodiments, the method further includes retrieving the stored weight data and the CRC data. The method may further include estimating whether weight values included in the retrieved weight data include an error using the CRC data. The method may further include for each weight value estimated to include an error, substituting the weight value with a default value. The default value may nullify or lessen an effect of the weight value in the neural network. The weight value may be represented as a binary array, and estimating whether the weight value includes an error may include detecting an odd number of bit flips in the weight value. The weight values may be represented as binary arrays, and the CRC data may include a respective check bit appended to each weight value. The method may further include estimating whether weight values include an error by performing a modulo operation on each weight value and its appended check bit. The method may further include training the neural network using the retrieved weight data.

In one or more embodiments, the weight data include weight values for the neural network, and the method further comprises representing the weight values using Hamming-distance-based binary representation.

The foregoing summary is illustrative and is not intended to be in any way limiting. In addition to the illustrative aspects, embodiments, and features described above, further aspects, embodiments, and features will become apparent by reference to the following drawings and the detailed description.

Figure 1:
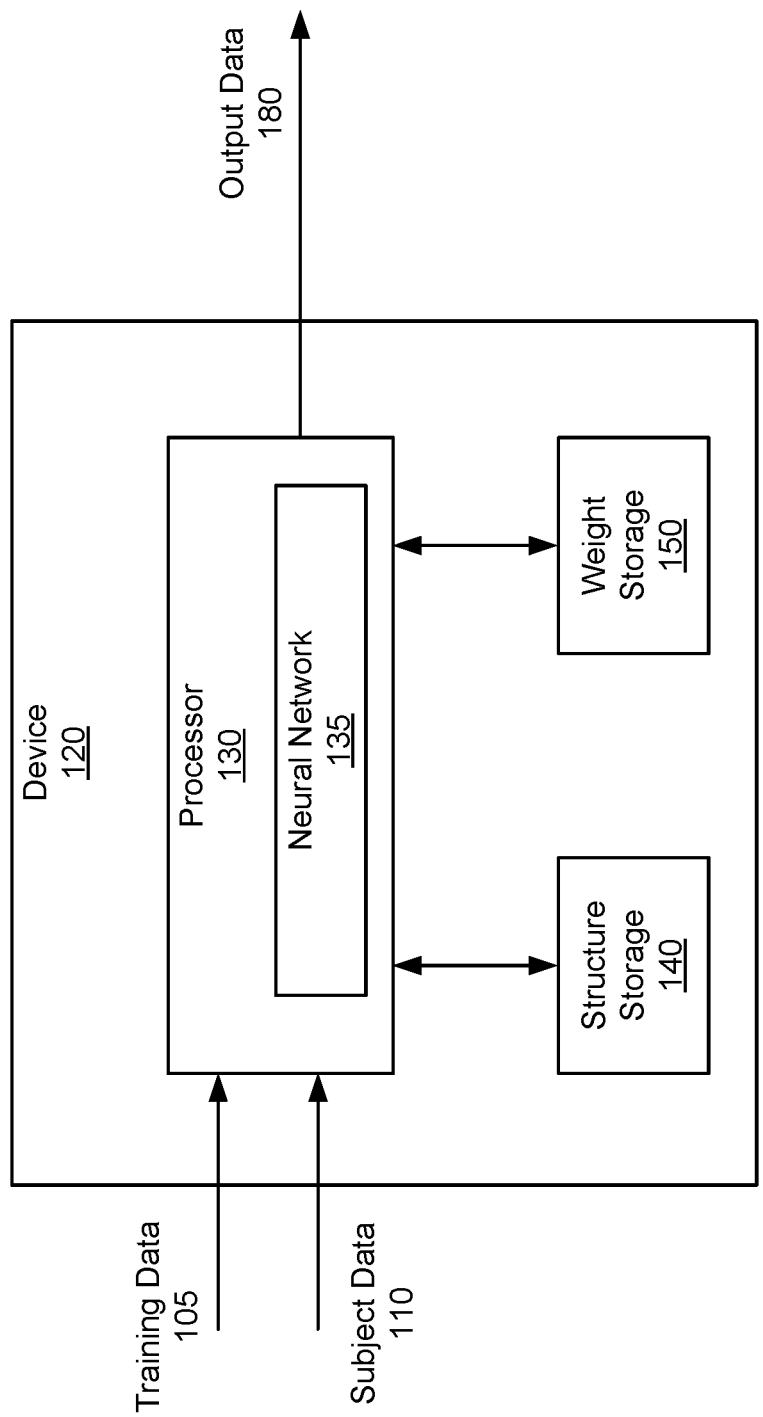
FIG. 1 is a schematic diagram of a memory system for storing a neural network in accordance with an illustrative embodiment.

The foregoing and other features of the present disclosure will become apparent from the following description and appended claims, taken in conjunction with the accompanying drawings. Understanding that these drawings depict several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Disclosed is a device for storing and constructing a neural network by detecting weight values (also referred to as "weights" herein) of the neural network associated with faulty cells. The neural network may be any computing model that may be used to determine a feature in input data through various computations. A neural network may determine a feature (e.g., a number, shape, pattern, etc.) in input data (e.g., audio data, image data, video data, etc.) according to a structure that defines a sequence of computations to be performed, and weight values that define coefficients applied to the computations. Weights or weight values may be scaling factors between two or more nodes. For example, weight of a neural network may be synaptic weights. For example, the structure may be represented as connections of different nodes, where each node represents a summation of its inputs, and a weight value associated with a connection may represent a coefficient or a scaling factor multiplied to an output of a node in that connection. Examples of the neural network include a convolutional neural network, feedforward neural network, probabilistic neural network, etc. In some embodiments, the device includes a first plurality of cells for storing a structure of the neural network, and a second plurality of cells for storing weight values of the neural network. The faulty cells are memory cells from the second plurality of cells storing incorrect values (e.g., bits that are errors). A faulty cell is a memory cell that is unable to accurately store a binary value and/or unable to return a correct binary value when the memory cell is read. A faulty cell may be a faulty cell when it is first fabricated. Alternatively, or in addition, a faulty cell may comprise a non-faulty cell that changes to become a faulty cell after one or more memory operations are conducted using the non-faulty cell. For example, in one embodiment, a faulty cell is a stuck-at-fault cell of a resistive memory device. For another example, faulty cells are one or more memory cells that together store incorrect weight values different from target weight values or intended weight values due to defects in the memory cells or due to an incorrect process of writing values into the memory cells, for example, because of timing violations. For example, a target weight value or an intended weight value may be stored in three memory cells which each represent one bit of the intended weight value, for example, '110,' but may have an incorrect weight value represented as '100' due to the memory cell storing he second bit being a faulty cell. One or more faulty cells together may be used to store data representing a weight value for a node of an artificial neural network.

In one or more embodiments, the device further includes a processor that detects the faulty cells through indicators. As used herein, an indicator comprises any flag, data bit, signal, data structure, value, or setting that records that a particular memory cell is a faulty memory cell. Representative examples of an indicator that may be used in certain embodiments, include a data bit, a switch, a flip-flop, and the like. An indicator, in certain embodiments, may record or indicate that a particular set of memory cells such as a byte (8 memory cells) has at least one memory cell that is a faulty memory cell. In one aspect, an indicator is one or more bits indicative of whether one or more associated memory cells store a defective weight value. For example, the indicator may be a flag indicating that a vector of memory cells includes at least a stuck-at-fault cell. The processor may determine whether the vector of memory cells stores an incorrect weight value based on the flag. For another example, the indicator may be a cyclic redundancy check (CRC) bit added to a vector of memory cells. The processor may perform CRC on the vector with the CRC bit, and determine whether the vector of memory cells stores an incorrect weight value by performing CRC on the on the vector of cells and the CRC bit.

In response to determining that one or more memory cells store a defective weight value, the processor may ignore the weight value stored by the one or more memory cells. For example, the processor may substitute the weight value with a default value (e.g., zero) to construct the neural network.

Advantageously, the disclosed device allows a storage of a neural network and a construction of the neural network, while eschewing ECC. ECC may introduce a latency of data processing and consume additional storage space (e.g., ~20-30% of the memory device). By omitting ECC, the disclosed device can construct a neural network without scarifying accuracy and performance of the neural network.

Example Memory System

Referring to FIG. 1, illustrated is a schematic diagram of a device 120, in accordance with an illustrative embodiment. In one embodiment, the device 120 includes a processor 130, a structure storage 140 storing structure data indicative of a structure of a neural network 135 and a weight storage 150 storing weight data indicative of weight values of the neural network 135. The processor 130 receives training data 105 to train the neural network 135, and stores updated weight values of the trained neural network 135 at the weight storage 150 after training. The processor 130 constructs the neural network 135 based on the structure data stored by the structure storage 140 and the weight data stored by the weight storage 150. The processor 130 applies the subject data 110 to the constructed neural network 135 to generate output data 180. The output data may indicate whether a feature of the subject data 110 is detected. In some embodiments, the device 120 includes more, fewer, or different components than shown in FIG. 1.

In one aspect, the processor 130 is a hardware component that constructs the neural network 135. In one approach, the processor 130 constructs the neural network 135 through weight substitution or weight elimination. Weight substitution refers to substituting a weight value of a memory cell (or a vector of memory cells) with a default value. The default value could be a whole number, a negative number, a positive or negative decimal number, a fraction, or any other value that will minimally impact the efficiency and accuracy of the neural network comprised of nodes and weights. Representative examples of a default value may comprise 0, 1, −1, 0.5, or the like. Weight elimination refers to eliminating the weight of the memory cell (or the vector of memory cells) or substituting the weight of the memory cell (or the vector of memory cells) with a zero. In one approach, the processor 130 detects weight values of the neural network associated with faulty cells, and performs weight substitution or weight elimination on the detected weight values. The faulty cells are memory cells from the weight storage 150 potentially storing incorrect weight values. For example, faulty cells are stuck-at-fault cells of a resistive memory device. For another example, faulty cells are memory cells storing incorrect weight values due to defects in the memory cells or due to an incorrect process of writing values into the memory cells. In response to detecting a faulty cell, the processor 130 may substitute weight values stored by the faulty cell (or a vector of memory cells including the faulty cell) with a default value (e.g., zero). By performing weight substitution or weight elimination based on the detection of faulty cells, computation resources for storing and constructing the neural network 135 can be conserved by eschewing expensive ECC. Detailed description of detecting faulty cells and performing weight substitution are provided below with respect to FIGS. 2 through 9.

The structure storage 140 is a storage device storing structure data indicative of a structure (e.g., connections of different nodes) of the neural network 135. The weight storage 150 is a storage device storing weight data indicative of weight values of the neural network 135. In some embodiments, memory cells of the structure storage 140 and the weight storage are different memory cells of the same memory device, different array of the same memory device, or memory cells of different memory devices. In some embodiments, the structure storage 140 is embodied as a dynamic random access memory (DRAM) device, where the weight storage 150 is embodied as a resistive memory device, or other types of memory devices (e.g., magnetoresistive memory (MRAM) or phase change memory (PCRAM)). Generally, the amount of storage for storing the weight data is much larger than the structure data, thus storing the weight data by the resistive memory device is cost efficient than storing by the DRAM device. In some embodiments, the structure data and the weight data may be stored by a single memory device. For example, the structure data is stored by first memory cells of a resistive memory device, and the weight data is stored by second memory cells of the same resistive memory device. In some embodiments, the structure storage 140 and the weight storage 150 can be any combination of non-volatile memory technology (e.g., NAND, MRAM, PCM, ReRAM, etc.) and volatile memory (e.g., SRAM and DRAM).

A flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Other types of non-volatile storage devices, in addition to NAND flash memory, can also be used to implement the new technology claimed and described herein. For example, a TANOS structure (consisting of layers of TaN—Al2O3-SiN—SiO2 on a silicon substrate), which is a memory cell configured to trap charge in a nitride layer (instead of a floating gate), can also be used with the technology described herein. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Another example is described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. No. 7,005,350 discloses a non-volatile memory cell having a trapping dielectric sandwiched between two silicon dioxide layers. Multi-state data storage is implemented by separately reading the binary states of the spatially separated charge storage regions within the dielectric.

Other types of non-volatile memory technologies may also be used in conjunction with the technology disclosed herein. For example, any suitable type of solid-state storage media may be used, such as, among others, NOR flash memory, nano RAM ("NRAM"), magnetoresistive RAM ("MRAM"), phase change RAM ("PRAM"), Racetrack memory, Memristor memory, nanocrystal wire-based memory, silicon-oxide based sub-10 nanometer process memory, graphene memory, Resistive random-access memory ("RRAM"), programmable metallization cell ("PMC"), and conductive-bridging RAM ("CBRAM").

One example of a ReRAM memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

Figure 2:
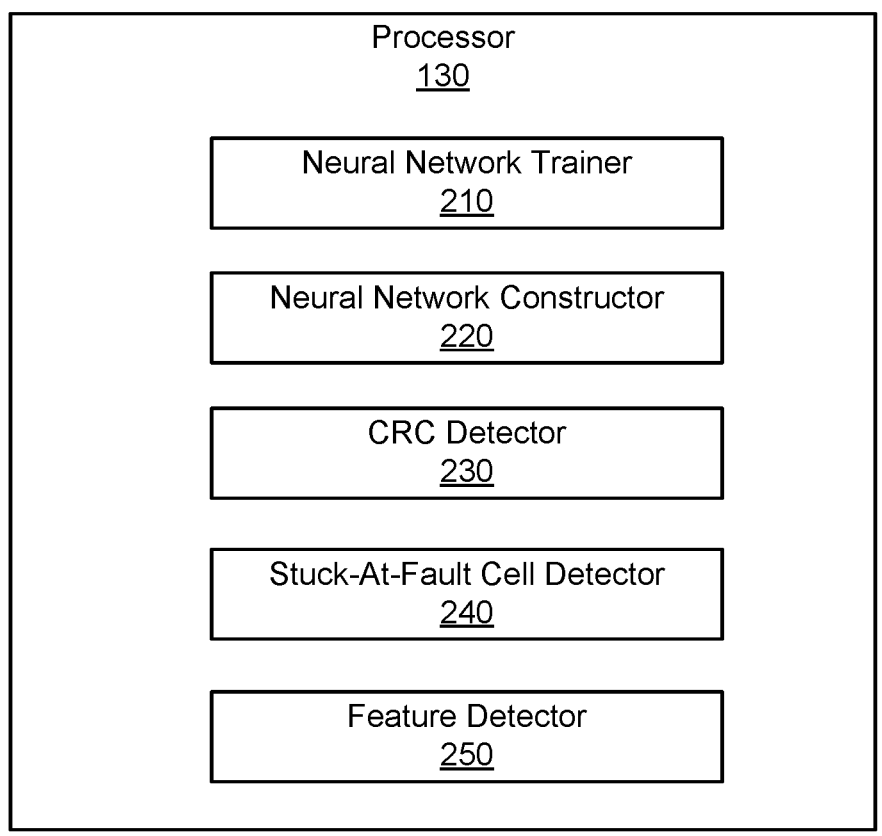
FIG. 2 is a detailed schematic diagram of a processor for storing a neural network in accordance with an illustrative embodiment.

Referring to FIG. 2, illustrated is a detailed schematic diagram of the processor 130 for storing the neural network 135 in accordance with an illustrative embodiment. In one embodiment, the processor 130 forms a neural network trainer 210, a neural network constructor 220, a CRC detector 230, a stuck-at-fault cell detector 240, and a feature detector 250. The processor 130 may execute instructions stored by a non-transitory computer readable medium to form these components as software modules. In some embodiments, some of these components may be embodied as an application specific integrated circuit, a field programmable gate array, or any combination of them. Together, these components of the processor 130 operate together to train the neural network 135, store the neural network 135, construct the neural network 135, and apply subject data 110 to the constructed neural network 135 for testing. In some embodiments, the processor 130 forms more, fewer, or different components than shown in FIG. 2.

The neural network trainer 210 is a component that trains the neural network 135. In one approach, the neural network trainer 210 generates structure data indicating a network structure of the neural network 135, and generates weight data indicating weight values of the neural network 135. The structure defines connections of different nodes with corresponding inputs and outputs, and the weight values define scaling factors applied to corresponding inputs or outputs of the nodes. Initial structure and weight values of the neural network 135 may be determined according to a user input or according to a default setting. The neural network trainer 210 receives training data 105 and trains the neural network 135 to adjust the weight values of the neural network 135, the structure of the neural network 135 or a combination of them. By applying a large set (e.g., over millions of image files) of training data 105, the neural network 135 can determine weight values allowing the neural network 135 to detect a target feature (e.g., an object, face, mouth, lips, nose, ears, a movement of an object, face or body expression, etc.) in the subject data 110 with high accuracy. Once the neural network 135 is trained, the neural network trainer 210 stores the structure data by the structure storage 140 and the weight data by the weight storage 150.

The CRC detector 230 is a component that determines whether a memory cell or a vector of memory cells stores an incorrect weight value. A vector of memory cells herein refers to any set of memory cells that collectively represent a single weight value. For example, a single weight value may be represented by 15 bits, where each cell represents a single bit. These 15 bits define a vector used to store a corresponding weight. In one approach, the CRC detector 230 adds an indicator to the vector of memory cells (e.g., 15 bits). The indicator may be a single bit or multiple bits indicative of whether the vector stores an incorrect weight value. The CRC detector 230 may perform write and read operations as modeled by a binary symmetric channel (BSC) on the indicator and the vector of memory cells, and perform CRC to determine whether the vector of memory cells stores a correct weight value or not. In a binary symmetric channel, the stored value being flipped from '0' to '1' or from '1' to '0' has a low probability. In one example, the CRC detector 230 receives a 16-bit representation of a weight, where 15 bits represent the binary expansion of the weight while the last one bit is the indicator added such that the modulo-two sum of all 16 bits is zero if there are no errors in the stored values. The CRC detector 230 obtains a modulo-two sum of the 16-bit representation, the CRC detector 230 may determine whether the vector of memory cells includes a faulty cell or not based on the modulo-two sum. If any odd number of bits is flipped from their target values, the CRC detector 230 determines that the vector of memory cells stores an incorrect weight value. Because each bit error may occur with a small probability, if any error exists in the vector of memory cells, the vector of memory cells will likely include a single faulty cell. Hence, the single bit indicator for the vector of memory cells is sufficient to determine whether the vector of memory cells stores a correct or incorrect weight value. If the CRC is correct (e.g., modulo-two sum is '0'), the CRC detector 230 may extract 15 bits and convert those bits into a data value representing the weight by excluding the one bit indicator from the 16-bit representation. If the CRC is incorrect (e.g., modulo-two sum is '1'), the CRC detector 230 may apply the default value for the incorrect weight value. Example processes performed by the CRC detector 230 are discussed below with respect to FIGS. 6A and 6B.

The stuck-at-fault cell detector 240 is another component that determines whether a memory cell or a vector of memory cells stores an incorrect weight value. In one aspect, the stuck-at-fault cell detector 240 detects an indicator associated with a memory cell or a vector of cells. A stuck-at-fault cell may be any cell with a value that is no longer selectively changeable to another value (e.g., stuck at a '0' or '1' value) in NAND, MRAM, PCM, RERAM, etc. The indicator may be a single bit or multiple bits indicative of whether the associated cell is a stuck-at-fault cell or the associated vector of memory cells includes a stuck-at-fault cell. The stuck-at-fault cell may be a faulty or worn-out cell of a resistive memory, where a value of the stuck-at-fault cell is permanently stuck at '0' or '1,' rendering a weight value stored by the memory cell or the vector of memory cells to be incorrect. The stuck-at-fault cell detector 240 may apply test signals to memory lines to detect if the memory cells are stuck or not. In response to determining that the memory cell is a stuck-at-fault cell or the vector of memory cells includes the stuck-at-fault cell, the stuck-at-fault cell detector 240 may assign an indicator indicating that the tested cell is a stuck-at-fault cell or the tested vector of memory cells includes the stuck-at-fault cell.

The neural network constructor 220 is a component that constructs the neural network 135. The neural network constructor 220 may retrieve structure data from the structure storage 140 and weight data from the weight storage 150, and construct the neural network 135 based on the structure data and the weight data retrieved. In one approach, the neural network constructor 220 may determine faulty cells storing incorrect weight values, and perform weight substitution or weight elimination based on the determined faulty cells before constructing the neural network 135. The neural network constructor 220 may determine one or more faulty cells (e.g., a memory cell or a vector of memory cells storing an incorrect weight value) based on an indicator associated with the one or more faulty cells. In response to determining one or more faulty cells, the neural network constructor 220 may perform weight substitution or weight elimination. That is, the neural network constructor 220 may exclude a subset of weight values stored by the faulty cells, and construct the neural network 135 based on (i) a structure of the neural network as indicated by the structure data and (ii) another subset of the weight values stored by non-faulty cells as indicated by the weight data. The neural network constructor 220 may construct the neural network 135 further based on substituted weight values. Through the disclosed weight substitution (or weight elimination), the neural network 135 may be constructed without retraining of the neural network 135 or performing an ECC process.

Assuming as an example, a neural network includes a plurality of weight values stored by a plurality of cells, where each weight value is represented by 7 bits with one bit indicator assigned to the 7 bits, making 8 bits total. Each bit is represented by a corresponding cell, hence a vector or a subset of seven cells collectively may represent a single weight value. In response to determining that at least one bit of the vector of (or the subset of) cells associated with a weight value W1 is a faulty cell as indicated by the one bit indicator assigned to the vector of cells, the neural network constructor 220 may exclude the 7 bits of the weight value W1 and the one bit indicator. Rather than use an erroneous weight value, a default or substitute weight value may be used, such as 0. In one example, a correct binary representation of a target weight value W1 is '1101101,' but the actual weight value stored by, or read back from, a vector of cells is '1111101' because of one or more faulty cells. The indicator '1' may be added to the front of the vector to form an 8 bit representation '11111101' to indicate that at least one of the memory cells storing the weight value W1 is a faulty cell. Based on the indicator assigned to the weight value W1, the neural network constructor 220 may determine that the weight value W1 may be incorrect. Hence, the neural network constructor 220 may exclude the weight value W1 stored by the vector of 7-bit cells, and use a default value, substitute value or zero when constructing the neural network. The neural network constructor 220 constructs the neural network 135 based on a structure of the neural network and other weight values stored by non-faulty cells. The neural network constructor 220 may substitute the weight value W1 with a default value (e.g., '0000000'), and construct the neural network 135 based on the structure of the neural network, other weight values stored by non-faulty cells and the substituted weight value W1.

In one approach, the neural network constructor 220 determines a number of faulty cells based on the indicators, and performs weight substitution or weight elimination according to the number of faulty cells. If the number of faulty cells is within a predetermined threshold, substituting weight values stored by the faulty cells to a default value (e.g., zero) or eliminating those weight values allows the accuracy of the neural network 135 to satisfy an accuracy standard (e.g., 97% accuracy). Thus, if the number of faulty cells is within the predetermined threshold, the neural network constructor 220 performs weight substitution or weight elimination, and constructs the neural network 135 after the weight substitution or weight elimination. However, if the number of faulty cells is more than the predetermined threshold, even after substituting the weight values or eliminating the weight values, the accuracy of the neural network 135 may be still below the accuracy standard (e.g., 97% accuracy). Hence, if the number of faulty cells is more the predetermined threshold, the neural network constructor 220 may cause the neural network trainer 210 to retrain the neural network 135 or a portion of the neural network 135, and construct the neural network 135 after retraining. The association between the number of faulty cells and the accuracy of the neural network 135 may be empirically determined through statistical analysis. Assuming for an example that, if more than 2.5% of memory cells of the weight storage 150 are faulty cells, an accuracy of the neural network 135 even after substituting (or eliminating) weight values stored by the faulty cells is below 97%. In this example, if the neural network constructor 220 determines that less than 2.5% of memory cells are faulty cells, the neural network constructor 220 performs weight substitution or weight elimination on the faulty cells, and constructs the neural network 135 based on the weight substitution. On the other hand, if the neural network constructor 220 determines that more than 2.5% of memory cells are faulty cells, the neural network constructor 220 retrains the portion of the neural network 135 including the faulty cells or the entire neural network 135, and constructs the neural network 135 based on the retraining.

In some embodiments, the neural network constructor 220 is a means for detecting a subset of a plurality of memory cells, where the subset of the plurality of memory cells includes stuck-at-fault cells. Moreover, the neural network constructor 220 is a means for substituting a default value for a set of weights of a neural network, where the set of the weights is stored at least in part by the stuck-at-fault cells. Furthermore, the neural network constructor 220 is a means for constructing the neural network based on (i) a stored structure of the neural network, (ii) another set of the weights of the neural network stored by another subset of the plurality of memory cells, and (iii) the substituted default value.

The feature detector 250 is a component that applies subject data to the neural network 135 to determine a feature in the subject data. The subject data may be audio data, image data, video data, or any combination of them to be tested. In case of a face recognition application, the feature detector 250 may determine one or more features (e.g., lips, nose, eyes, eyebrows, contour, facial expression, etc.) of a face in an image or a video. In case of a body recognition application, the feature detector 250 may determine one or more features (e.g., a hand, a leg, a contour, a gesture, etc.) of a body in an image or a video. By applying the subject data to the neural network 135, the feature detector 250 can determine whether one or more features are detected in the subject data, and generate output data 180 indicating one or more detected features in the subject data.

Figure 3A:
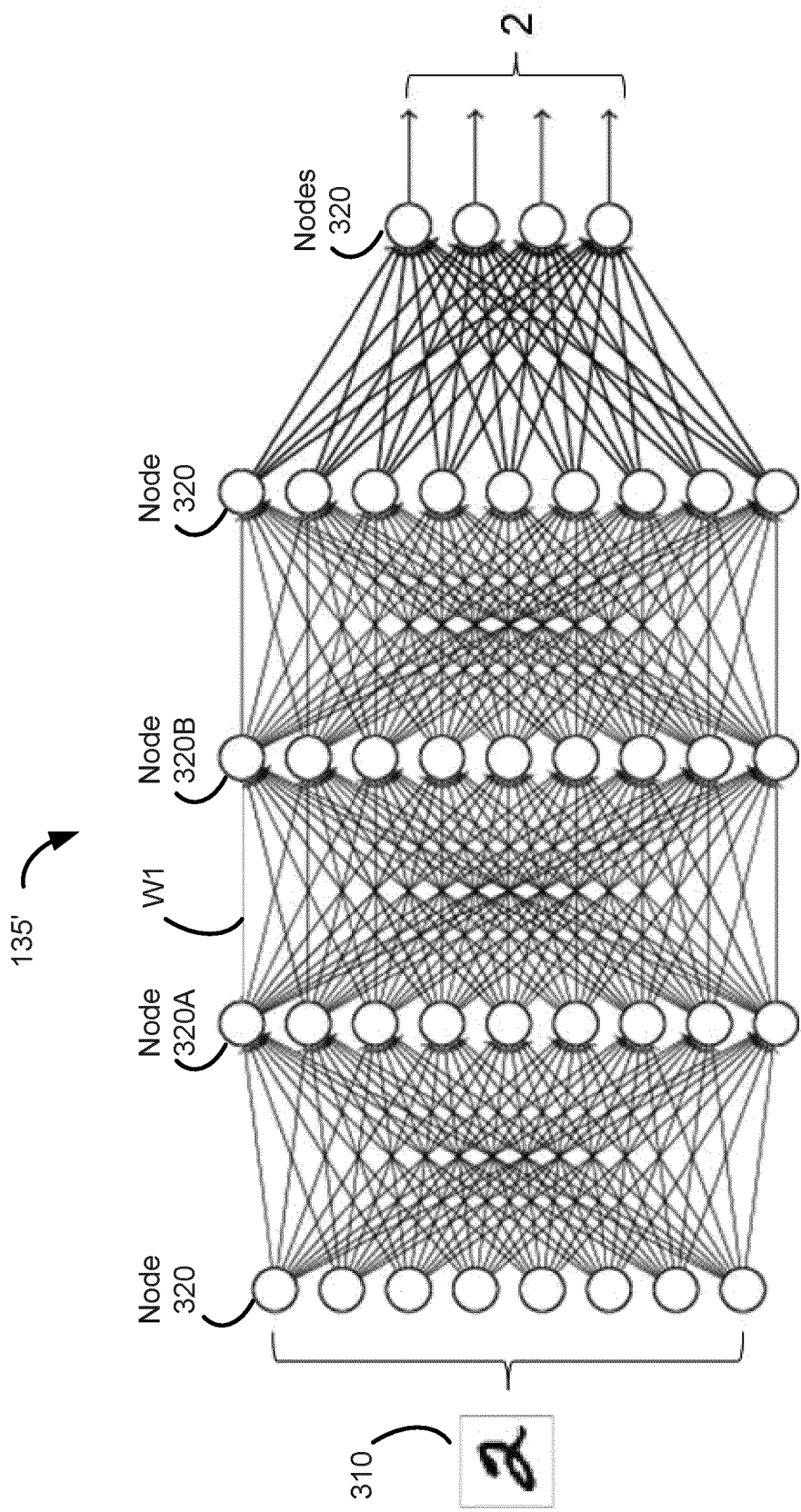
FIG. 3A is an example neural network before weight substitution in accordance with an illustrative embodiment.

Referring to FIG. 3A, illustrated is an example neural network 135 before weight substitution in accordance with an illustrative embodiment. The neural network 135 may have a convolutional neural network structure. Specifically, the neural network 135 includes a plurality of nodes 320, and weight values W, where each weight value W is represented as a connection between two corresponding nodes 320. In one aspect, each node sums its inputs and outputs the summation. Each weight value W represents a scaling factor for multiplication applied to an output of a node to apply the multiplied value as an input to the subsequent node connected to the node. For example, the node 320A sums all of its inputs and generates an output value. The output value of the node 320A is multiplied by a weight value W1, and the multiplied result is applied to the node 320B as an input. The node 320B similarly receives different inputs, and sums all of its inputs to generate an output value. Through numerous calculations performed, the neural network 135 may receive image data 310, and apply the image data 310 to the neural network 135 to determine or recognize a feature (e.g., a number two) in the image data 310.

Figure 3B:
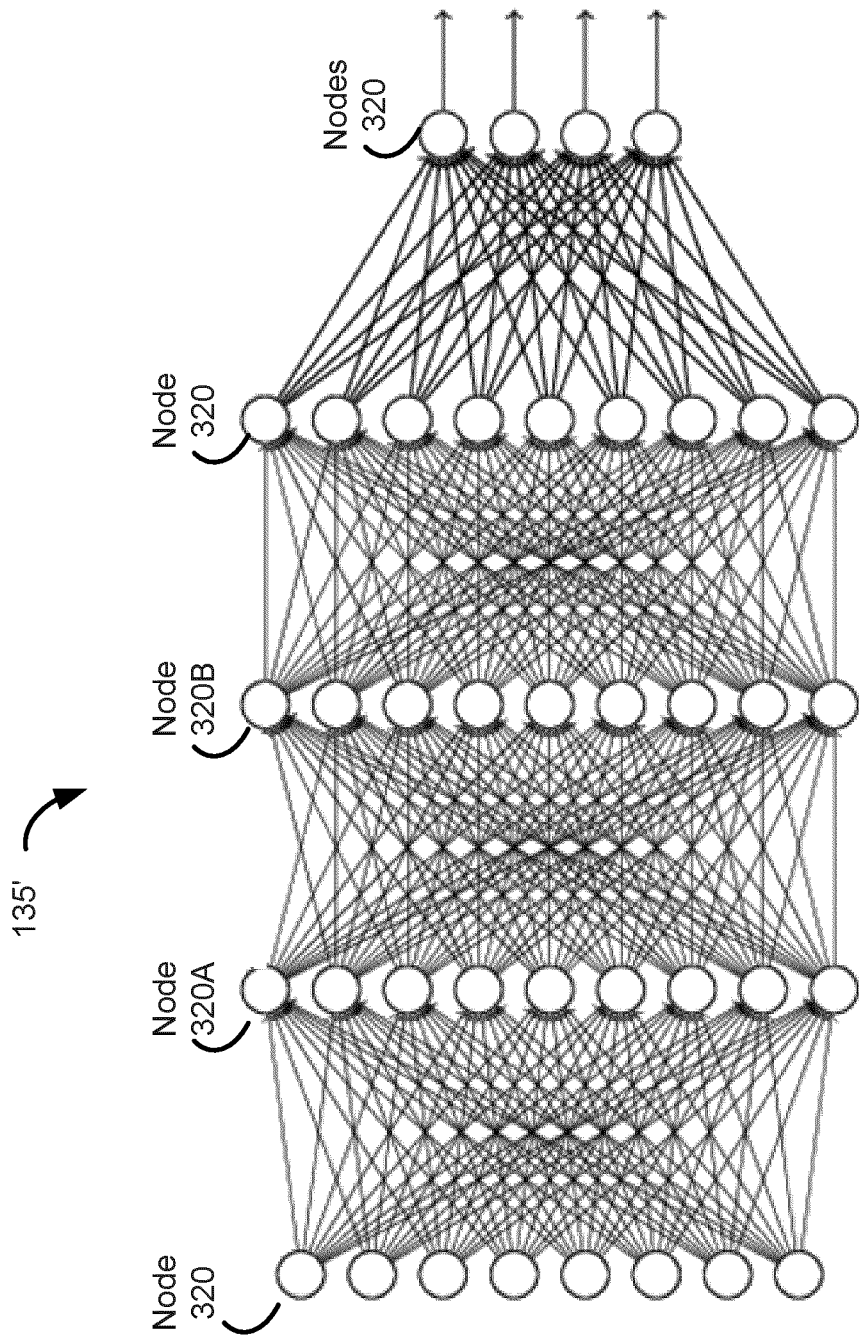
FIG. 3B is an example neural network after weight substitution in accordance with an illustrative embodiment.

Referring to FIG. 3B, illustrated is an example neural network 135' after weight substitution in accordance with an illustrative embodiment. Assuming that the weight value W1 of FIG. 3A was stored by a faulty cell, the neural network constructor 220 may substitute the weight value W1 with a default value or a zero. In one aspect, substituting the weight value W1 with a zero is equivalent to eliminating the weight value W1. By substituting or eliminating the possible incorrect weight value W1, the neural network 135' can perform with high accuracy without retraining the neural network 135. In one approach, a structure of the neural network 135' may be modified to remove a connection between the node 320A and the node 320B.

Figure 4:
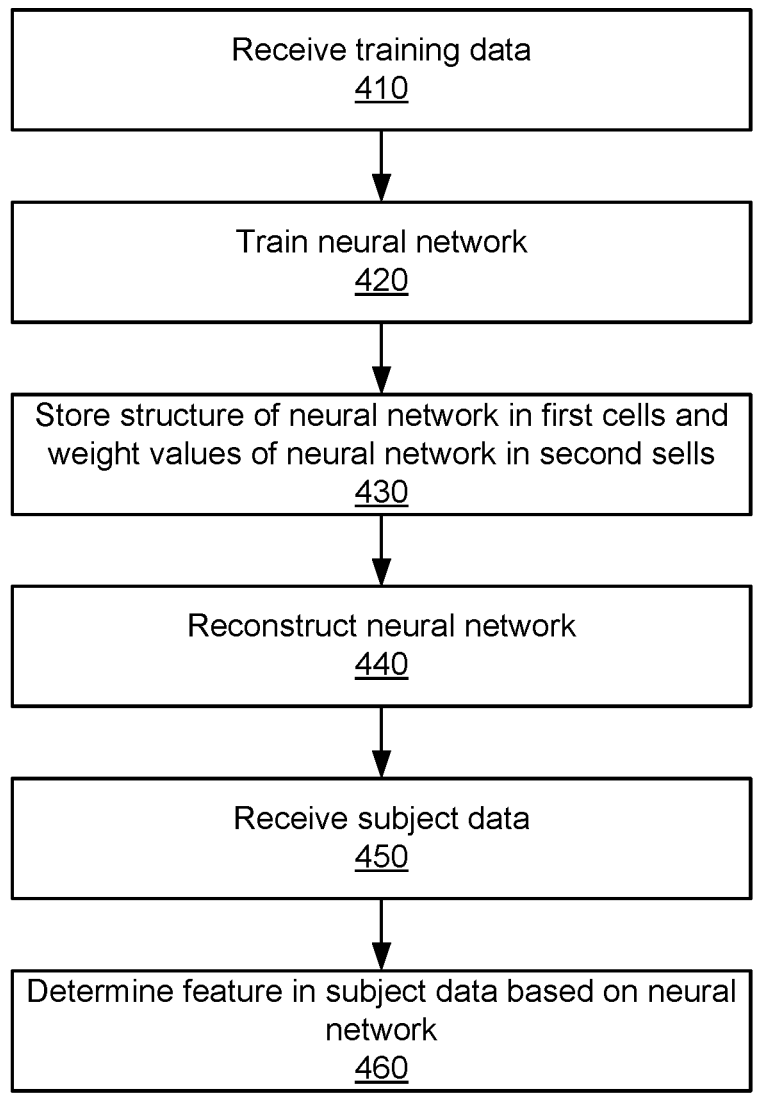
FIG. 4 is a flowchart of a process of performing detection or recognition of a feature in subject data through the neural network in accordance with an illustrative embodiment.

Referring to FIG. 4, illustrated is a flowchart of a process 400 of performing detection or recognition of a feature in subject data through the neural network 135 in accordance with an illustrative embodiment. The process 400 may be performed by the processor 130 of FIG. 1. In some embodiments, the process 400 may be performed by other entities. In some embodiments, the process 400 includes more, fewer, or different steps than shown in FIG. 4.

The processor 130 receives training data 105 in operation 410, and trains the neural network 135 by applying the training data 105 to the neural network 135 to tune the weight values of the neural network 135 in operation 420. The processor 130 stores structure data indicating a structure of the neural network 135 in first cells and weight data indicating weight values of the neural network 135 in second cells in operation 430. The first cells and the second cells may be part of different memory devices. In one implementation, the first cells are part of a DRAM device, and second cells are part of a resistive memory device. In another implementation, the first cells and the second cells are part of a same memory device (e.g., resistive memory device).

The processor 130 reconstructs the neural network 135 by retrieving the structure data from the first cells and by retrieving the weight data from the second cells in operation 440. The processor 130 may reconstruct the neural network 135 in response to a request by a user to reconstruct the neural network 135 or a request to detect a feature in subject data 110. The processor 130 may determine one or more faulty cells potentially storing incorrect weight values, and perform weight substitution or weight elimination for weights stored by the faulty cells or vectors of cells that include the faulty cells. The processor 130 may detect the faulty cells using indicators associated with the faulty cells, as described in detail below with respect to FIGS. 5 through 9 below.

The processor 130 receives subject data to be tested in operation 450, and applies the subject data to the neural network 135 to determine a feature in the subject data in operation 460. The processor 130 generates output data 180 indicating the detected feature.

Figure 5:
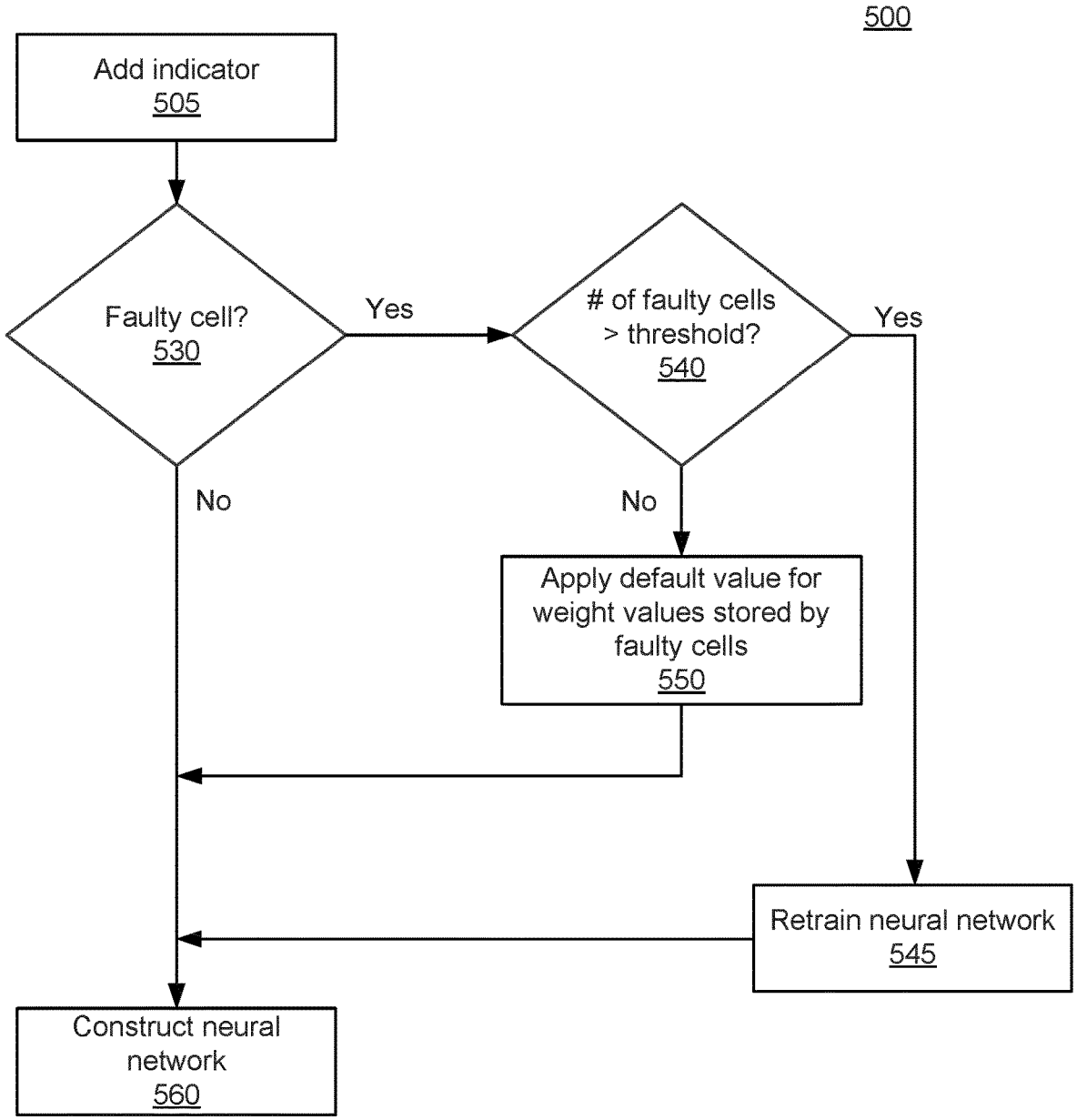
FIG. 5 is a flowchart of a process of constructing a neural network in accordance with an illustrative embodiment.

Referring to FIG. 5, illustrated is a flowchart of a process 500 of constructing the neural network 135 in accordance with an illustrative embodiment. The process 500 may be performed by the neural network trainer 210, the neural network constructor 220, and the stuck-at-fault cell detector 240 of FIG. 2. In some embodiments, the process 500 may be performed by other entities. In some embodiments, the process 500 includes more, fewer, or different steps than shown in FIG. 5.

The stuck-at-fault cell detector 240 adds an indicator to its associated cell or a vector of memory cells in operation 505. In one approach, the stuck-at-fault cell detector 240 detects faulty cells (e.g., stuck-at-fault cells), and assigns indicators to the detected stuck-at-fault cells, or vectors of cells including the stuck-at-fault cells. In this embodiment, each indicator indicates whether an associated cell or an associated vector of memory cells includes a faulty cell or not.

The neural network constructor 220 detects faulty cells based on the indicators in operation 530. If the neural network constructor 220 determines that there is no faulty cell, the neural network constructor 220 constructs the neural network 135 based on (i) structure data indicating a structure of the neural network 135 stored by first memory cells of the structure storage 140 and (ii) weight data indicating weight values of the neural network 135 stored by second memory cells of the weight storage 150 in operation 560.

If the neural network constructor 220 detects faulty cells based on the indicators, the neural network constructor 220 determines a number of faulty cells in operation 540. If the number of faulty cells is less than a predetermined threshold, the neural network constructor 220 performs weight substitution by applying a default value (e.g., zero) for weight values stored by the faulty cells in operation 550. After the weight substitution, the neural network constructor 220 constructs the neural network 135 according to substituted weight values in operation 560. If the number of faulty cells is larger than the predetermined threshold, the neural network constructor 220 causes the neural network trainer 210 to retrain the neural network 135 (or a portion of the neural network 135) in operation 545, and the neural network constructor 220 constructs the neural network 135 according to the retrained weight values in operation 560.

Figure 6A:
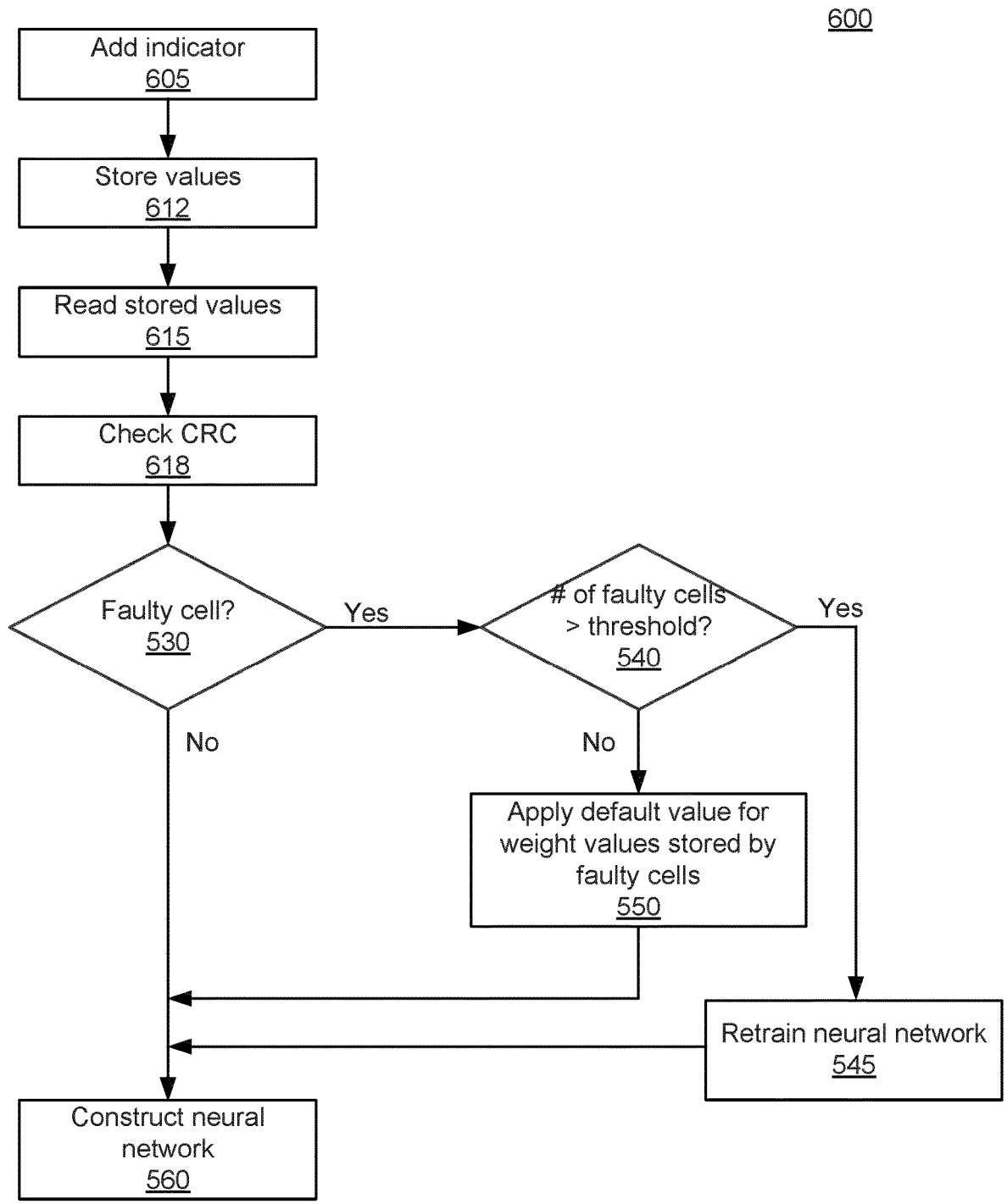
FIG. 6A is a flowchart of a process of constructing a neural network in accordance with another illustrative embodiment.

Referring to FIG. 6A, illustrated is a flowchart of a process 600 of constructing the neural network 135 in accordance with another illustrative embodiment. The process 600 may be performed by the neural network trainer 210, the neural network constructor 220, and the CRC detector 230 of FIG. 2. In some embodiments, the process 600 may be performed by other entities. In some embodiments, the process 600 includes more, fewer, or different steps than shown in FIG. 6A.

The CRC detector 230 adds an indicator to its associated vector of memory cells in operation 605. The indicator may be a single bit added to an associated vector of memory cells. The indicator is indicative of whether the associated vector of memory cells includes a faulty cell. In one approach, the CRC detector 230 stores the indicator and the vector of memory cells in operation 612. The CRC detector 230 reads the stored indicator and the vector of memory cells in operation 615, for example, in response to an instruction to construct the neural network 135 from the processor 130. In one aspect, storing and reading are performed as modeled by BSC. The CRC detector checks the CRC to determine whether the vector of memory cells includes a faulty cell in operation 618, as described above with respect to FIG. 2.

The steps 530, 540, 545, 550 and 560 in FIG. 6A are identical to those described with respect to FIG. 5. Thus, the detailed description thereof is omitted herein for the sake of brevity.

Figure 6B:
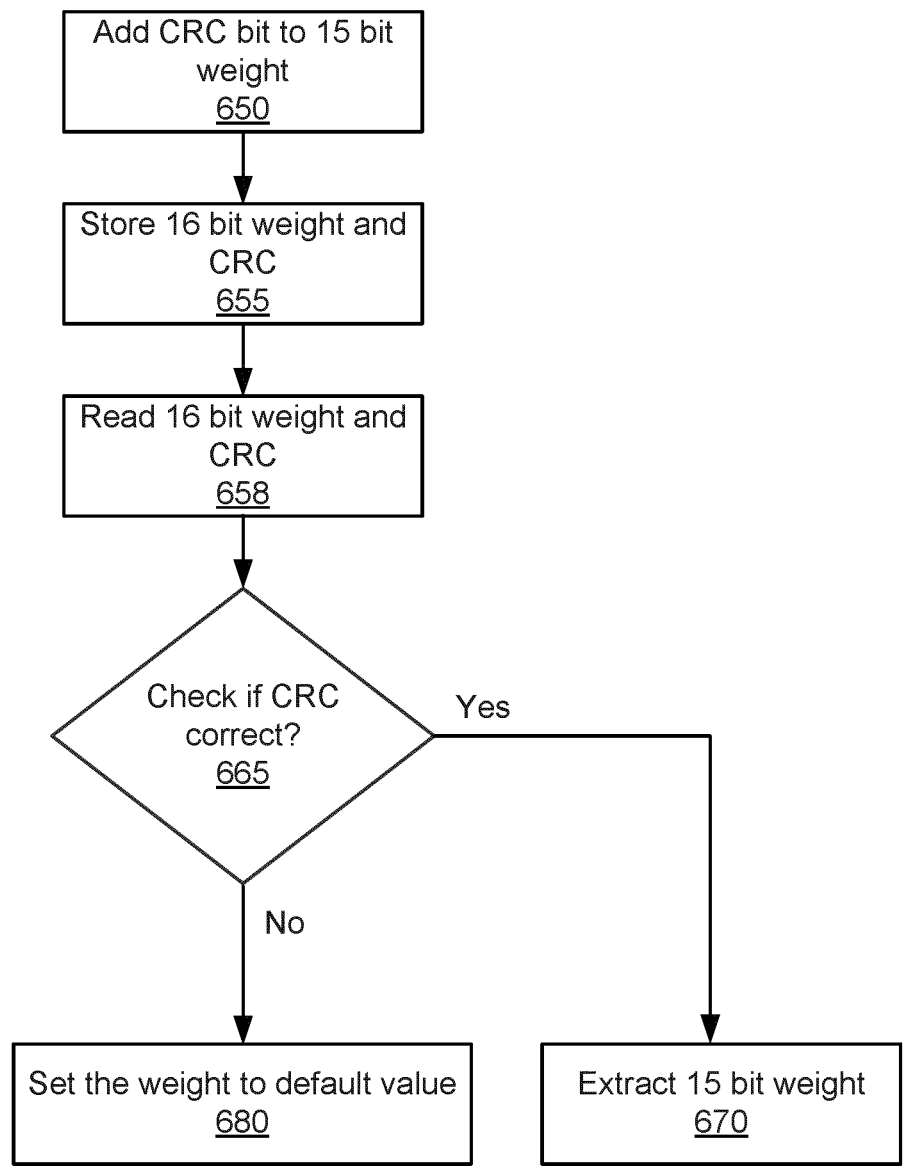
FIG. 6B is a flowchart of another process of constructing a neural network in accordance with another illustrative embodiment.

Referring to FIG. 6B, illustrated is a flowchart of a process 640 of constructing the neural network 135 in accordance with another embodiment. The process 640 may be performed by the CRC detector 230 of FIG. 2. In some embodiments, the process 640 may be performed by other entities. In some embodiments, the process 640 includes more, fewer, or different steps than shown in FIG. 6B.

The CRC detector 230 adds a CRC bit to a 15-bit representation of a weight in an operation 650. In one approach, the CRC bit is an indicator that allows the modulo-two sum of all 16 bits to be zero. The CRC detector 230 stores the 16-bit representation including the 15-bit representation of the weight and the CRC bit in operation 655. The CRC detector 230 reads the 16-bit representation in operation 658, for example, in response to an instruction to construct the neural network 135 from the processor 130. In one aspect, the CRC detector 230 performs write and read operations on the 16-bit representation including the one bit indicator as modeled by BSC. The CRC detector 230 determines whether the CRC is correct or not in an operation 665. If any odd number of bits is flipped from their target values, the CRC detector 230 determines that the vector of memory cells stores an incorrect weight value. Because each bit error may occur with a small probability, if any error exists in the vector of memory cells, the vector of memory cells (e.g., 15 memory cells) will likely include a single faulty cell. Hence, the single bit indicator for the vector of memory cells is sufficient to determine whether the vector of memory cells stores a correct or incorrect weight value. If the CRC is correct, the CRC detector 230 may extract the 15 bit weight in an operation 670 by excluding the CRC bit from the 16-bit representation. If the CRC is incorrect, the CRC detector 230 may apply the default value (e.g., zero) for the incorrect weight value in an operation 680.

Figure 7:
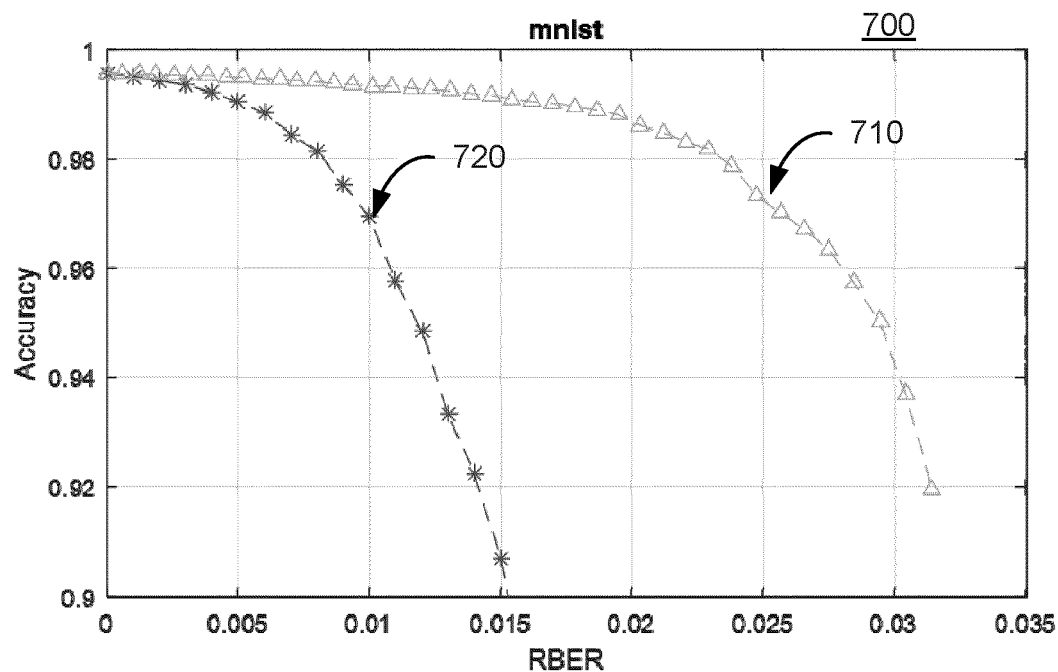
FIG. 7 is a plot showing a performance comparison of an accuracy of a detection performed with a disclosed weight substitution and an accuracy of a detection performed without the disclosed weight substitution.

Referring to FIG. 7, illustrated is a plot 700 showing a performance comparison of an accuracy of a detection performed with a disclosed weight substitution and an accuracy of a detection performed without the disclosed weight substitution. Specifically, the plot 700 includes a curve 710 indicating a relationship between (i) a ratio of a number of faulty cells over a total number of memory cells for storing the weight values and (ii) an accuracy of the neural network 135 after performing weight substitution or weight elimination. In addition, the plot 700 includes a curve 720 indicating a relationship between (i) a ratio of a number of faulty cells over a total number of memory cells for storing the weight values and (ii) an accuracy of the neural network 135 without the weight substitution or weight elimination. The accuracy of the neural network 135 in FIG. 7 is tested based on modified national institute of standards and technology database (MNIST database). As shown by the curve 720, the accuracy of the neural network 135 without the disclosed weight substitution falls below 97%, when more than 1% of the memory cells are faulty cells. However, the accuracy of the neural network 135 with the disclosed weight substitution falls below 97%, when more than 2.5% of the memory cells are faulty cells. Accordingly, the disclosed weight substitution improves the performance of the neural network 135 for a given number of faulty cells without relying on expensive ECC or retraining the neural network 135.

Figure 8:
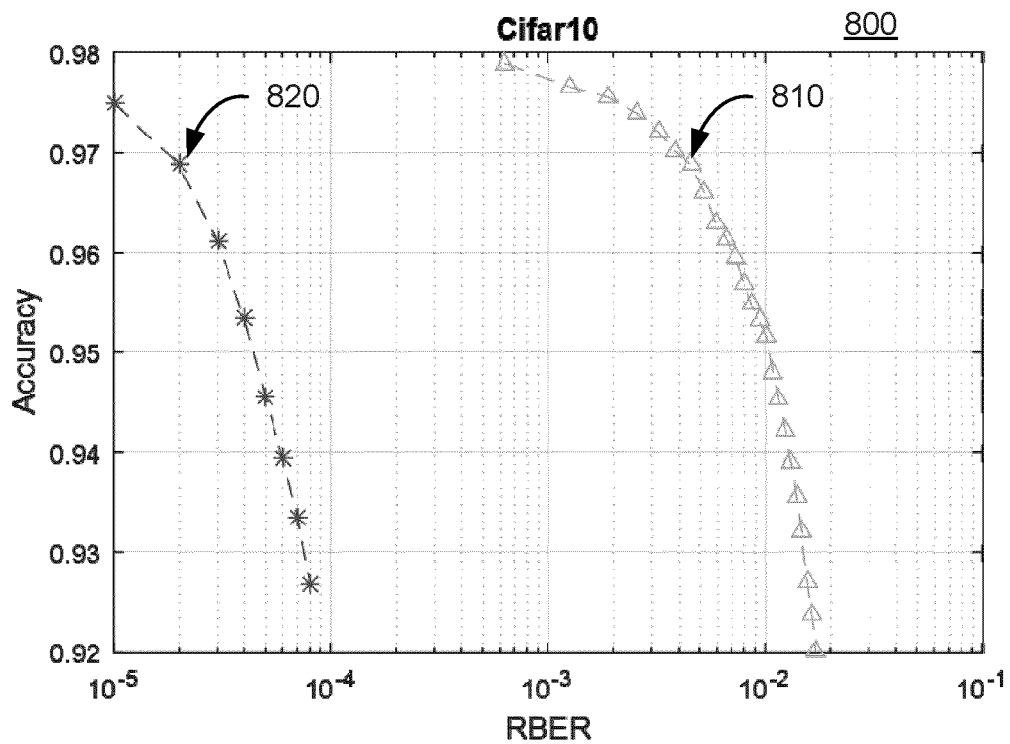
FIG. 8 is a plot showing another performance comparison of an accuracy of a detection performed with a disclosed weight substitution and an accuracy of a detection performed without the disclosed weight substitution.

Referring to FIG. 8, illustrated is a plot 800 showing another performance comparison of an accuracy of a detection performed with a disclosed weight substitution and an accuracy of a detection performed without the disclosed weight substitution. Specifically, the plot 800 includes a curve 810 indicating a relationship between (i) a ratio of a number of faulty cells over a total number of memory cells for storing the weight values and (ii) an accuracy of the neural network 135 after performing weight substitution or weight elimination. In addition, the plot 800 includes a curve 820 indicating a relationship between (i) a ratio of a number of faulty cells over a total number of memory cells for storing the weight values and (ii) an accuracy of the neural network 135 without the weight substitution or weight elimination. The accuracy of the neural network 135 in FIG. 8 is tested based on CIFAR-10 database. As shown by the curves 810, 820, the disclosed weight substitution allows a ratio between the faulty cells and total memory cells storing the weight values of the neural network 135 for a given accuracy of the performance of the neural network 135 to improve by more than two orders of magnitudes. For example, as shown by the curve 820, the accuracy of the neural network 135 without the disclosed weight substitution falls below 97%, when more than 0.002% of the memory cells are faulty cells. However, as shown by the curve 810, the accuracy of the neural network 135 with the disclosed weight substitution falls below 97%, when more than 0.5% of the memory cells are faulty cells.

Figure 9:
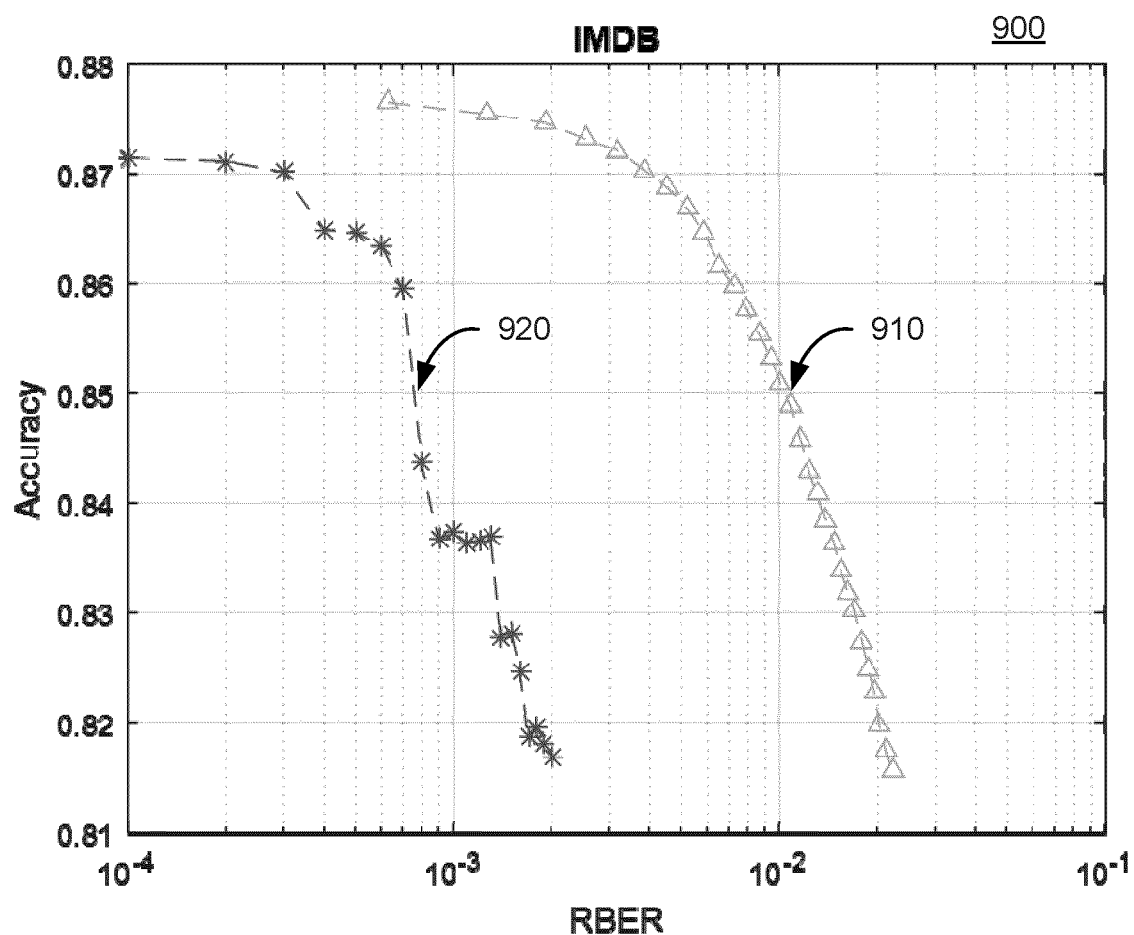
FIG. 9 is a plot showing another performance comparison of an accuracy of a detection performed with a disclosed weight substitution and an accuracy of a detection performed without the disclosed weight substitution.

Referring to FIG. 9, illustrated is a plot 900 showing another performance comparison of an accuracy of a detection performed with a disclosed weight substitution and an accuracy of a detection performed without the disclosed weight substitution. Specifically, the plot 900 includes a curve 910 indicating a relationship between (i) a ratio of a number of faulty cells over a total number of memory cells for storing the weight values and (ii) an accuracy of the neural network 135 after performing weight substitution or weight elimination. In addition, the plot 900 includes a curve 920 indicating a relationship between (i) a ratio of a number of faulty cells over a total number of memory cells for storing the weight values and (ii) an accuracy of the neural network 135 without the weight substitution or weight elimination. The accuracy of the neural network 135 in FIG. 9 is tested based on IMDB database. As shown by the curves 910, 920, the disclosed weight substitution allows a ratio between the faulty cells and total memory cells storing the weight values of the neural network 135 for a given accuracy of the performance of the neural network 135 to improve by more than an order of magnitude. For example, as shown by the curve 920, the accuracy of the neural network 135 without the disclosed weight substitution falls below 85%, when more than 0.07% of the memory cells are faulty cells. However, as shown by the curve 910, the accuracy of the neural network 135 with the disclosed weight substitution falls below 85%, when more than 1% of the memory cells are faulty cells.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A device comprising:
    a plurality of memory cells configured to store weights of a neural network, the plurality of memory cells comprising one or more faulty cells; and
    a processor coupled to the plurality of memory cells, the processor configured to:
        construct a neural network based on a stored structure of the neural network and a subset of the weights stored by a subset of the plurality of memory cells, without another subset of the weights stored by one or more memory cells comprising the one or more faulty cells.

2. The device of claim 1, wherein the plurality of memory cells comprise one of resistive memory cells and phase change memory cells.

3. The device of claim 1, wherein the one or more faulty cells comprise one or more stuck-at-fault cells.

4. The device of claim 1, wherein the processor is configured to:
    perform a cyclic redundancy check on the plurality of memory cells, and
    detect the one or more faulty cells from the plurality of memory cells based on the cyclic redundancy check.

5. The device of claim 1, wherein the processor is configured to:
    construct the neural network by substituting zero for the another subset of the weights stored by the one or more memory cells comprising the one or more faulty cells.

6. The device of claim 5, wherein the processor is configured to:
    construct the neural network by substituting the zero for the another subset of the weights stored by the one or more memory cells, in response to determining that a ratio between a number of the one or more faulty cells and a number of the plurality of memory cells is less than a predetermined threshold.

7. The device of claim 1, wherein the processor is configured to:
    retrain the weights stored by the plurality of memory cells, in response to detecting the one or more faulty cells.

8. The device of claim 1, wherein the processor is configured to:
    retrain the another subset of the weights stored by the one or more memory cells and bypass retraining the subset of the weights stored by the subset of the plurality of memory cells, in response to detecting the one or more faulty cells.

9. The device of claim 1, wherein the plurality of memory cells are non-erasable.

10. The device of claim 1, wherein the processor is further configured to:
    receive input data indicating an image, audio, or a combination of the image and the audio, and
    determine a feature in the input data according to the neural network constructed based on the stored structure of the neural network and the subset of the weights stored by the subset of the plurality of memory cells.

11. The device of claim 1, wherein the stored structure of the neural network is stored by a first memory device, and the weights are stored by the plurality of memory cells of a second memory device different from the first memory device.

12. The device of claim 1, wherein the processor is configured to bypass error correction code processing while constructing the neural network without the another subset of the weights stored by the one or more memory cells comprising the one or more faulty cells.

13. A device comprising:
    a plurality of memory cells configured to store weights of a neural network, each weight stored by a corresponding vector of memory cells of the plurality of memory cells, each vector associated with a corresponding indicator indicative of whether the vector stores an incorrect weight; and a processor coupled to the plurality of memory cells, the processor configured to:
  detect a vector of memory cells of the plurality of memory cells storing the incorrect weight based on the corresponding indicator associated with the detected vector,
  substitute a default value for the incorrect weight stored by the detected vector, and
  construct the neural network based on the substituted default value.

14. The device of claim 13, wherein each indicator comprises a single bit.

15. The device of claim 13, wherein the processor is further configured to:
  perform a cyclic redundancy check on the detected vector of the memory cells and the corresponding indicator associated with the detected vector; and
  detect whether the detected vector of the memory cells stores the incorrect weight based on the cyclic redundancy check.

16. The device of claim 13, wherein each indicator indicates whether a corresponding cell is a stuck-at-fault cell.

17. The device of claim 13, wherein the plurality of memory cells are memory cells of a resistive non-volatile memory device.

18. The device of claim 13, wherein the processor is configured to:
  construct the neural network by substituting the default value, in response to determining that a ratio between a number of memory cells storing incorrect weights and a number of the plurality of memory cells is less than a predetermined threshold.

19. A method comprising:
  detecting a subset of a plurality of memory cells, the subset of the plurality of memory cells including stuck-at-fault cells;
  substituting a default value for a set of weights of a neural network, the set of the weights stored at least in part on the stuck-at-fault cells; and
  constructing the neural network based on a stored structure of the neural network, another set of the weights of the neural network stored by another subset of the plurality of memory cells, and the substituted default value.

20. The method of claim 19, further comprising:
  substituting the default value for the set of the weights, in response to determining that a ratio between a number of the stuck-at-fault cells and a number of the plurality of memory cells is less than a predetermined threshold.

21. A device comprising:
  means for detecting a subset of a plurality of memory cells, the subset of the plurality of memory cells including stuck-at-fault cells;
  means for substituting a default value for a set of weights of a neural network, the set of the weights stored by the stuck-at-fault cells; and
  means for constructing the neural network based on a stored structure of the neural network, another set of the weights of the neural network stored by another subset of the plurality of memory cells, and the substituted default value.

* * * * *